(12) United States Patent
Verbeyst et al.

(10) Patent No.: US 6,839,657 B2
(45) Date of Patent: Jan. 4, 2005

(54) METHOD OF AND AN ARRANGEMENT FOR CHARACTERIZING NON-LINEAR BEHAVIOR OF RF AND MICROWAVE DEVICES IN A NEAR MATCHED ENVIRONMENT

(75) Inventors: Frans Verbeyst, Merchtem (BE); Jan Verspecht, Steenhuffel (BE)

(73) Assignee: Agilent Technologies, Inc., Palo Alto, CA (US)

( * ) Notice: Subject to any disclaimer, the term of this patent is extended or adjusted under 35 U.S.C. 154(b) by 79 days.

(21) Appl. No.: 10/252,855

(22) Filed: Sep. 23, 2002

(65) Prior Publication Data

US 2003/0057963 A1 Mar. 27, 2003

(30) Foreign Application Priority Data

Sep. 24, 2001 (EP) .............................. 01203651

(51) Int. Cl.⁷ ............................................ G01F 19/00
(52) U.S. Cl. ..................................... 702/182; 324/76.42
(58) Field of Search ........................... 702/182, 67, 71, 702/75, 107, 188, 189, 57, 58, 59, 81, 82, 183, 184, 185; 324/76.11, 76.42

(56) References Cited

U.S. PATENT DOCUMENTS

| | | | |
|---|---|---|---|
| 5,276,411 A | 1/1994 | Woodin, Jr. et al. | 333/22 R |
| 6,025,709 A | 2/2000 | Bradley | 324/158.1 |
| 6,613,593 B2 * | 9/2003 | Tanaka et al. | 438/16 |
| 6,629,009 B1 * | 9/2003 | Tamaki | 700/108 |
| 6,635,872 B2 * | 10/2003 | Davidson | 250/307 |
| 6,639,393 B2 * | 10/2003 | Tasker et al. | 324/76.19 |

FOREIGN PATENT DOCUMENTS

| | | |
|---|---|---|
| EP | 0 321 808 | 6/1989 |
| EP | 0 715 177 | 6/1996 |
| WO | WO 88/08969 | 11/1988 |

OTHER PUBLICATIONS

Fritz, S., Examiner. European Search Report, application No. EP 01 20 3651, dated Apr. 19, 2002.
Ferrero et al. "Novel Hardware and Software solutions . . . " IEEE Inc. New York, vol. 43, no. 2, Apr. 1, 1994, pp. 299–305, XP000439069.
Teeter D A et al. "Prediction of HBT ACPR . . . " Technical Digest, New York, Oct. 12, 1997, pp. 41–44, XP010251622.
Berghoff G et al. "Automated Characterization of HF Power Transistors . . . " IEEE Inc. vol. 46, no. 12, Dec. 1998, pp. 2068–2073, XP000793237.

* cited by examiner

Primary Examiner—Edward Raymond

(57) ABSTRACT

A method of and an arrangement for characterizing non-linear behavior of RF and microwave devices under test in a near matched environment. The method comprises the steps of exciting the device by an RF signal under different load conditions, measuring signal data at input and output ports of the device, verifying whether the measurement data meet predetermined quality criteria; calculating, from the measurement data, model parameters of a predetermined model for characterizing the non-linear behavior of the device, and verifying assumptions made in the characterization model by collecting additional measurement data and comparing same with data calculated from the model using the model parameters calculated. The load conditions are obtained by connecting to the output port of the device a matched load, an open, a short and a plurality of attenuators and delays.

20 Claims, 3 Drawing Sheets

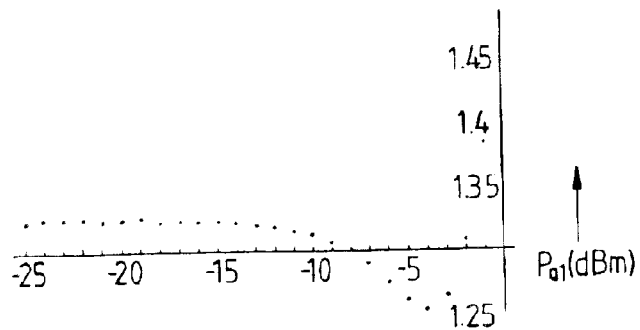
Fig. 3
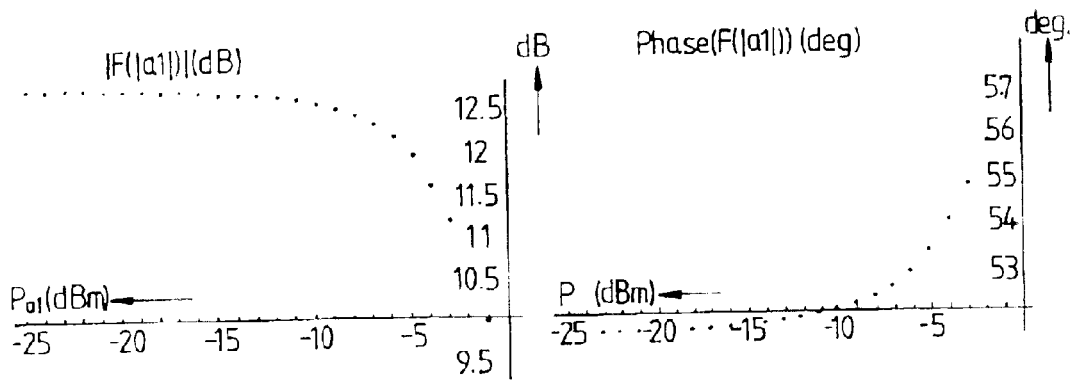
Fig. 4a          Fig. 4b
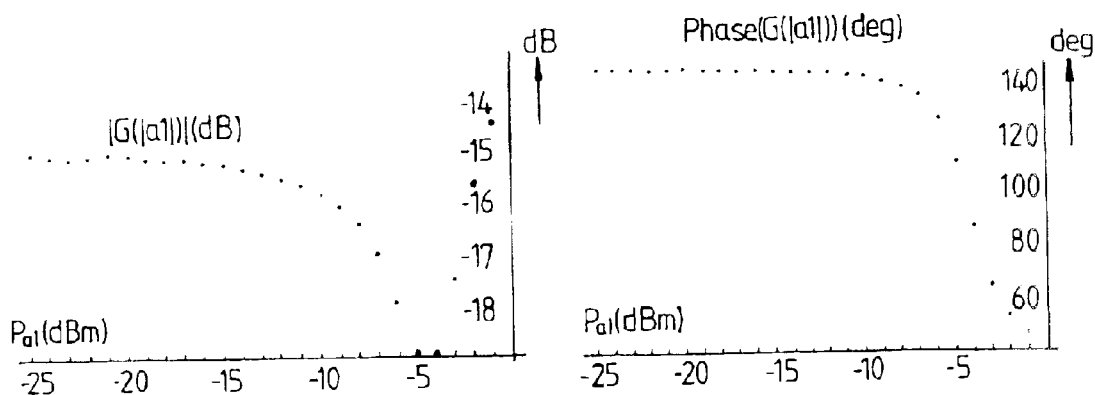
Fig. 5a          Fig. 5b

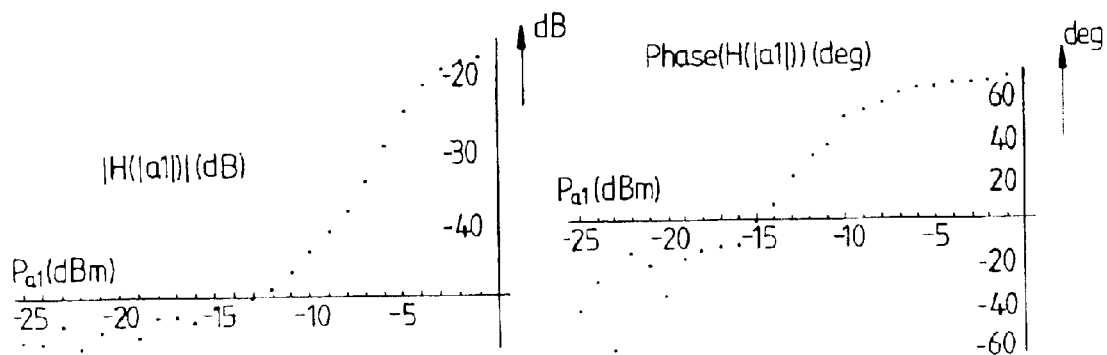
Fig. 6a Fig. 6b
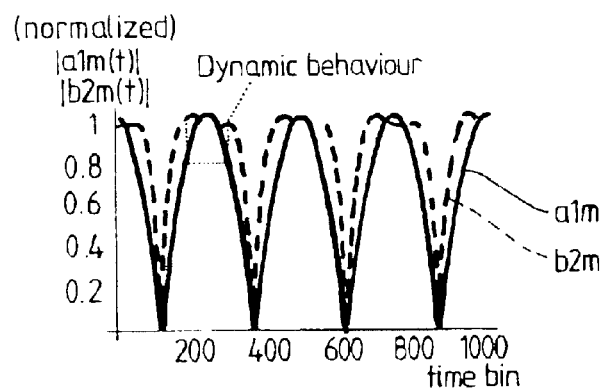
Fig. 7
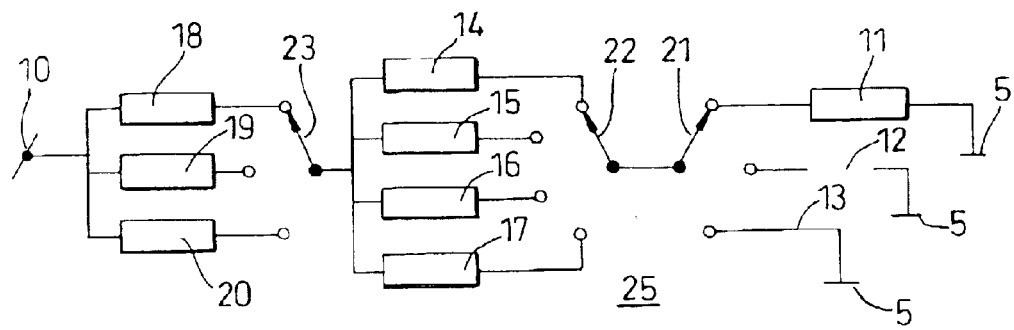
Fig. 8

METHOD OF AND AN ARRANGEMENT FOR CHARACTERIZING NON-LINEAR BEHAVIOR OF RF AND MICROWAVE DEVICES IN A NEAR MATCHED ENVIRONMENT

FIELD OF THE INVENTION

The present invention relates generally to Radio-Frequency (RF) and microwave technology, and more specifically to the characterization of non-linear RF and microwave signal behavior of an RF and microwave device.

BACKGROUND OF THE INVENTION

The linear signal behavior of RF and microwave devices is generally characterized by the well-known S-parameters. In practice, for a majority of the RF and microwave devices and applications the S-parameter approach suffices for characterizing the signal behavior of the device.

However, in recent applications of RF and microwave devices, such as power amplifiers for use in base stations and portable radio equipment of wireless radio communication systems, for achieving optimum RF transmit power at the output antenna of such a device and for providing maximum receiver sensitivity and low interference ratios, there is a need for characterizing the non-linear behavior of such devices. In particular for characterizing the non-linear RF and microwave signal behavior of these devices in a near matched load environment.

RF Integrated Circuits (ICs) are mounted on a Printed Circuit Board (PCB) with varying relative dielectric (epsilon) constants and varying widths of the transmission lines, resulting in variations in the equivalent impedance or load of the RFICs. Knowledge of the effects of these different loads on the non-linear behavior of the devices is valuable to both RFIC manufacturers and circuit designers and other users.

In practice, non-linear behavior of RF and microwave devices is analyzed by loading the device under test using passive or active loadpull techniques. Passive loadpull, however, requires readily expensive tuners. Active loadpull requires the availability of a second excitation source.

SUMMARY OF THE INVENTION

It is an object of the present invention to provide a novel and relatively simple approach for characterizing non-linear behavior of an RF and microwave device, without the need for expensive tuners or the like, which approach being suitable for use in automated test and measurement environments.

It is a further object of the present invention to provide equipment and a computer program product for use with and for performing the novel approach according to the present invention.

These and other objects and features are achieved according to the present invention in a method of characterizing non-linear behavior of a device under test, the device having input and output signal ports, wherein the method comprises the steps of:

exciting the device by an RF signal under different load conditions;

measuring signal data at the input and output ports of the device;

verifying whether the measurement data meet predetermined quality criteria;

calculating, from the measurement data, model parameters of a predetermined model for characterizing the non-linear behavior of the device, and verifying assumptions made in the characterization model by collecting additional measurement data and comparing same with data calculated from the model using the model parameters.

In the approach according to the present invention, a predetermined mathematical model or function forms the basis for the characterization of the non-linear behavior of the device under test, the model comprises model parameters which can be calculated or extracted from RF signal measurement data at the input and output ports of the device.

By collecting measurement data under different load conditions of the device, and by verifying whether the measurement data collection meets predetermined quality criteria, the model parameters can be calculated and verified by comparing data calculated from the model or function using the calculated model parameters and like data collected from additional measurements of the device under test.

Once verified, the non-linear behavior of RF and microwave devices under test can be accurately described under load mismatch conditions, in particular load mismatches in a near matched environment of the device.

The measurement data in the method according to the invention can be collected using well-known and inexpensive standard RF and microwave devices among others, a matched load, an open and a short and attenuators and delays. The load and attenuators and delays are selected and arranged such that a plurality of load mismatches of the device under test are created. By measuring the incident and reflected input and output RF signals at the input and output ports of the device using a Non-linear Network Measurement System, relevant measurement data are collected for calculating the model parameters in accordance with the predetermined mathematical model or function.

In a preferred embodiment of the method according to the invention, the attenuators are selected for collecting measurement data in a desired region of load mismatches, such as the near matched environment.

The delays are selected such that the load mismatches are as much as possible uniformly distributed along a circle in a Smith chart diagram, thereby providing an overdetermined set of equations to be solved for calculating the model parameters, by substituting the measurement data collection in the predetermined characterization model.

Such a set of linear equations can be relatively easily solved in a least square sense using, among others, singular value decomposition.

In order to obtain qualitatively justified results, the measurement data collection has to be verified whether predetermined quality criteria are met.

In an embodiment of the method according to the invention, the quality of the measurement data collection is verified from the condition number of the overdetermined set of equations, which condition number should be as close to one as possible, indicating a well-conditioned set of equations.

In another embodiment of the method according to the invention, the measurement data collection is verified whether the realized loads for the device under test are uniformly distributed along a circle in the Smith chart diagram.

In practice, the characterization model for characterizing the RF behavior of the device under test is developed based on one or a plurality of assumptions, in order to arrive at a set of linear equations.

In a yet further embodiment of the invention, wherein the predetermined characterization model is developed based on a linearity assumption with respect to incident signals at the output port of the device, the validity of this assumption is verified from calculating the "goodness of fit", being the squared cross-correlation of measured output signals and output signals of the device predicted in accordance with the model and model parameters obtained.

For those characterization models developed on the basis of a static behavior assumption, which is an assumption that has to be considered performing continuous wave excitation or modulated excitation of the device under test, in a yet further embodiment of the invention, this assumption is verified by providing a so-called dynamic compression characteristic, is a plot of the output time-varying signal amplitude at the output port versus the input time-varying signal amplitude at the input port of the device under test. If this dynamic compression characteristic does not show any or little hysteresis, this is an indication that the device under test can be considered as being static around the carrier of the continuous wave or modulated excitation signals.

The static behavior assumption can also be verified, in a still further embodiment of the invention, by verification of dynamics in bias signals of the device, such as bias currents. A dynamic behavior of the bias signals point towards the non-validity of the static behavior assumption for the device under test.

As already discussed above, the novel and inventive approach for characterizing nonlinear behavior of an RF and microwave device under test in accordance with the present invention, provides the use of relatively simple and inexpensive devices such as delays, attenuators and loads.

Accordingly, the invention relates also to an arrangement of delays, attenuators, a matched load, an open and a short, adapted for selectively combining any of these delays, attenuators and loads. In a preferred embodiment of the arrangement according to the invention, the delays, attenuators and loads connect through electronically controllable switching means, for use in an automated test environment. For the majority of RF and microwave devices, the delays, attenuators and loads are designed for use in a near 50 ohm measurement environment.

The invention further relates to a computer program product, comprising code means stored on a computer readable medium, such as but not limited to a floppy disk, a CD-Rom, or a database which is on-line retrievable, and arranged for performing the method according to the invention as disclosed above, when loaded on a processing device, such as a microcomputer or microprocessor. For automatic test and measurement suits, the computer program product is suitably arranged for automatically collecting measurement data and calculating and validating the model parameters extracted from the measured data collection.

The above-mentioned and other features and advantages of the invention are illustrated in the following description with reference to the enclosed drawings.

BRIEF DESCRIPTION OF THE DRAWINGS

A method and apparatus in accordance with this invention, for characterizing nonlinear behavior of RF and microwave devices, will now be described, by way of example, with reference to the accompanying drawings, in which:

FIG. 3 shows in a graphic representation the condition number of a set of equations obtained in accordance with the present invention, as function of increasing input power for the device under test;

FIGS. 4a, 4b, 5a, 5b, 6a and 6b show amplitude and phase diagrams of model parameters calculated in accordance with the present invention;

FIG. 7 shows an example of a so-called dynamic compression characteristic, visualizing the dynamic behavior (modulation) of the device under test in the time domain; and FIG. 8 shows in a schematic form, an example of an arrangement of loads, attenuators and delays for use with the method according to the present invention.

DETAILED DESCRIPTION OF THE EMBODIMENTS

Figure 1:
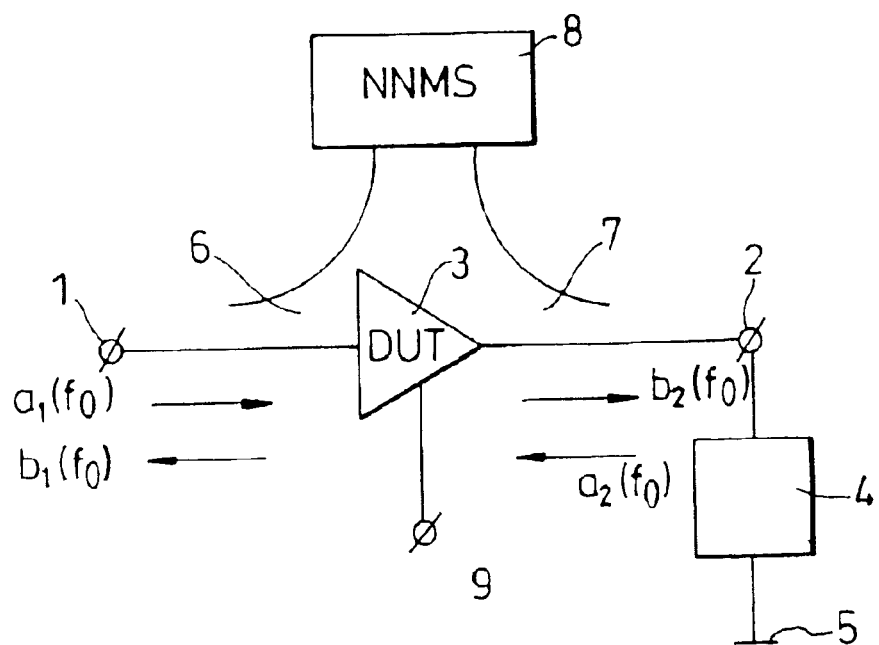
FIG. 1 shows a schematic test setup in accordance with the present invention.

FIG. 1 shows a general test setup for an RF and microwave Device Under Test (DUT) 3, having an input port 1 and an output port 2.

At the input port 1 of the DUT 3, the incident or input RF signal is indicated by $a_1(f_0)$ and the reflected signal is indicated by $b_1(f_0)$.

At the output port 2 of the DUT 3, the output signal is indicated by $b_2(f_0)$ and the reflected signal is indicated by $a_2(f_0)$.

At the output port 2 a load 4 connects to system ground 5. Through couplers 6, 7 network analyzer measurement means 8 connect to the input and output ports 1, 2, respectively. A suitable network analyzer for the purpose of the present invention is a Non-linear Network Measurement System (NNMS) commercially provided by Agilent Technologies.

The DUT 1 generally comprise one or more bias input terminals 9, for applying DC bias currents and voltages to the DUT 3.

As generally known to those skilled in the art, S-parameters are widely used to characterize the linear signal behavior of RF and microwave devices:

$$b_2(f_0)=S_{21}(f_0)a_1(f_0)+S_{22}(f_0)a_2(f_0) \quad (1)$$

wherein:

$f_0$=the RF carrier frequency at which the DUT 3 is excited.

For characterizing the non-linear behavior of an RF and microwave device, a mathematical model is proposed which is a natural extension of the S-parameters and can be obtained both as a linearized version of describing functions and the Volterra theory:

$$b_2(f_0)=F(|a_1(f_0)|)a_1(f_0)+G(|a_1(f_0)|)a_2(f_0)+H(|a_1(f_0)|) \; a_2^*(f_0)P^2_{a_1(f_0)} \quad (2)$$

wherein:

F, G and H are non-linear functions of the amplitude of the incident wave at the input port 1 of the DUT 3;

$P_x=e^{j\Phi(x)}$; and

\* represents the complex conjugate.

The above characterization model or function (2) is linear in the incident wave at the output port 2 of the DUT 3. For simplicity sake, harmonics of the incident signals are not taken into account. It can be shown that for small-signal incident waves, F will equal $S_{21}$, G will equal $S_{22}$ and H will be zero. The phase correction, $P^2_{a_1(f_0)}$ of the last term of equation (2) originates from the time invariant restriction, that is the model has to be insensitive to a delay at the input port 1.

An equivalent model exists using $Re(a_2(f_0))$ and $Im(a_2(f_0))$ instead of $a_2(f_0)$ and $a_2^*(f_0)$.

It can be shown that the non-linear functions F, G and H can be linearized using Volterra series with respect to $a_2(f_0)$ and neglecting harmonics at the input, resulting in:

$$F(|a_1(f_0)|) = \alpha + \chi \cdot |a_1(f_0)|^2 \qquad (3)$$

$$G(|a_1(f_0)|) = \beta + \delta \cdot |a_1(f_0)|^2 \qquad (4)$$

$$H(|a_1(f_0)|) = \epsilon \cdot |a_1(f_0)|^2 \qquad (5)$$

wherein $\alpha$, $\beta$, $\chi$, $\delta$, $\epsilon$ are model parameters.

In accordance with the present invention, in order to obtain $F(|a_1(f_0)|)$, $G(|a_1(f_0)|)$ and $H(|a_1(f_0)|)$ for a specified value of $|a_1(f_0)|$, measurement data are collected.

Theoretically, at least three different values of $a_2(f_0)$ have to be applied and the corresponding $b_2(f_0)$ have to be measured. However, in practice, in order to arrive at an overdetermined set of linear equations, it is recommended to apply more than three values of $a_2(f_0)$ under several load conditions of the device under test.

For loading the device under test under mismatched conditions, in accordance with the present invention, instead of using passive or active load pull for this purpose, relatively cheap and standard RF and microwave components such as a matched load, an open and short, combined with delay elements and attenuators are applied.

In order to clarify each of these steps, by way of example only, the model extraction process will be described for an LNA (Low-Noise Amplifier), i.e. the EC2612 of United Monolithic Semiconductors. This component is provided by IMEC, mounted (flip-chip) on an MCM wafer and initially used as part of their Wireless LAN system running at 5.25 GHz. As such this extraction process involves on-wafer measurements.

Before any data can be collected, one has to calibrate the system. In the case of the on-wafer measurement of the IMEC LNA, a LRRM (Line, Reflect, Reflect, Match) calibration is performed for the linear part of the calibration. In the case of connectorized measurements, a LOS (Load, Open, Short) calibration is used instead. Due to the non-linear measurements, also an absolute power cal and phase cal is included as part of the calibration process.

During the measurement of the IMEC LNA, a drain voltage of 3 V is used while the gate voltage is adapted to obtain a drain current of 14 mA. The incident wave is swept from −25 dBm up to 0 dBm, resulting in approx. 3.5 dB compression for the largest input power.

In order to obtain $F(|a_1(f_0)|)$, $G(|a_1(f_0)|)$ and $H(|a_1(f_0)|)$ for a specified value of $|a_1(f_0)|$, one has to apply at least 3 different values of $a_2(f_0)$ and measure the corresponding $b_2(f_0)$. In practice, one will apply more values of $a_2(f_0)$, i.e. a plurality of different load conditions at the output port 2 of the DUT 3 under test, in order to end up with an overdetermined set of linear equations.

In practice, these loads cannot be connected directly to the output port of the device. In the case of collecting the measurement data using an NNMS (Non-linear Network Measurement System) as commercially provided by Agilent Technologies, the loads have to be connected to the RF IN 2 port of the Calibration Module of the NNMS. Another possibility is to connect the loads to the IN 2 port of the Signal Separation Module of the NNMS, resulting in less loss and as such a larger reflection, i.e. $a_2(f_0)$, for the same load.

In accordance with the method of the invention, first a matched load, generally a 50 ohm load, is connected to the output port 2 of the DUT 3, ideally resulting in a zero reflection, i.e. $a_2(f_0)$ being zero. Next, an attenuator is selected (typically 3 dB, 6 dB or 10 dB). The attenuation values are selected for collecting measurement data for characterizing the nonlinear behavior of the device in a desired region of load mismatches. The smaller this region, the larger the attenuation to be used.

In the case of the LNA of IMEC, it turned out that even 0 dB attenuation (i.e. not using any attenuator at all) could be used due to the cable losses and coupler insertion losses in the Signal Separation Module and Calibration Module of the NNMS, which increase with increasing frequency. As such the RF IN 2 port of the NNMS is first left open and then shorted. The same (open/short) is repeated three times after adding a small delay, in this example realized using first one, then two and finally three connector savers. As a result 9 mismatches and as such 9 different values of $a_2(f_0)$ are applied to the device under test and which are shown in the Smith chart diagram of FIG. 2. The selection of the delay lines should be such that all realized mismatches are uniformly distributed along a circle in the Smith chart diagram.

Figure 2:
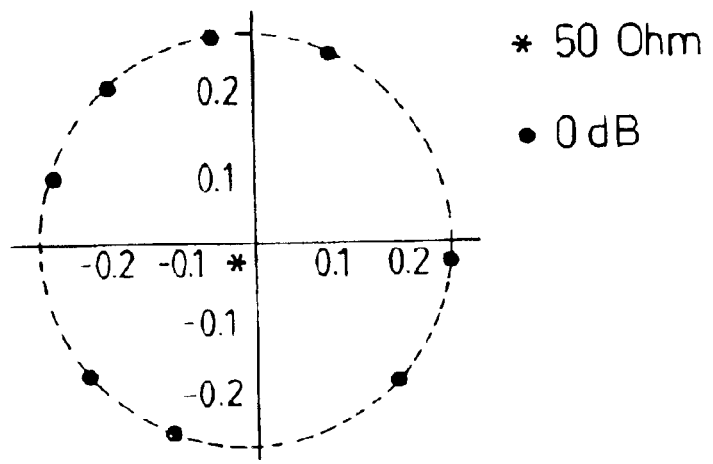
FIG. 2 shows in a graphic representation realized loads at the output port of a device under test.

In FIG. 2 it is interesting to notice that indeed a matched 50 Ohm load (at the RF IN 2 port of the NNMS), in practice, does not result in an exactly zero mismatch and that due to the losses mentioned above, the open/short ($|\Gamma_L|=1$ at the RF IN 2 port of the NNMS) results in a mismatch at the output port 2 of the DUT 3 of approximately 0.25 ($|\Gamma_L|$).

It is important to notice that the linearized describing function approach assumes that $|a_1(f_0)|$ remains constant while applying the different $a_2(f_0)$ to obtain the corresponding F, G and H values. Initially the equation proposed by the describing function approach was used:

$$b_2(f_0) = F'(|a_1(f_0)|) + G(|a_1(f_0)|) \; a_2(f_0) + H(|a_1(f_0)|) a_2^*(f_0) \cdot P^2_{a1(f0)} \qquad (7)$$

It was found that for small input powers and small reflections, the variation on $b_2(f_0)$ due to the (uncontrolled) measurement uncertainty on $a_1(f_0)$ was of the same order of magnitude of the variation on $b_2(f_0)$, due to the controlled variation of $a_2(f_0)$. This kind of subtle issues can be captured by (and at the same time explains one of the rationales of) performing repeated measurements. As such it can not be assumed that $F'(|a_1(f_0)|)$ is identical for each of the applied mismatches. Therefore a better model (taking the variation of $a_1(f_0)$ somewhat into account) was selected:

$$b_2(f_0) = F(|a_1(f_0)|) a_1(f_0) + G(|a_1(f_0)|) a_2(f_0) + H(|a_1(f_0)|) a_2^*(f_0) \; P^2_{a1(f0)} \qquad (7)$$

Ideally the realized loads, $\Gamma_L(f_0) = a_2(f_0)/b_2(f_0)$, should be uniformly distributed along a circle and this can easily be verified, see FIG. 2.

Another method, which requires solving the overdetermined set of linear equations, is to verify the condition number, which should be as close to one as possible, indicating a well-conditioned set of equations.

FIG. 3 shows the condition number as function of increasing input power for the IMEC LNA and turns out to be close to the ideal value (one). This number can be used to capture other issues, like the one mentioned above, i.e. the incorrect assumption that $|a_1(f_0)|$ remains constant while applying the different loads and that the variation on $b_2(f_0)$ is solely caused by a controlled variation of $a_2(f_0)$. It is found that in that case the condition number increases significantly for small input powers and when applying small mismatches (e.g. using a 10 dB attenuator).

By solving an overdetermined set of linear equations, for example in a least square sense using e.g. singular value decomposition, F, G and H are determined for each value of $|a_1(f_0)|$, within the specified range of interest. The inner portion of the circle of FIG. 2 corresponds to the validity region of the model with respect to the mismatch at the output port 2. It is important to remember to be very careful when extrapolating the model with respect to the mismatch, but especially with respect to $|a_1(f_0)|$.

FIGS. 4a and 4b, respectively, show the amplitude and phase of F as function of increasing input power. FIGS. 5a and 5b, respectively, show the amplitude and phase of G as function of increasing input power. FIGS. 6a and 6b, respectively, show the amplitude and phase of H as function of increasing input power.

As already mentioned above, for small values of $|a_1(f_0)|$, F is constant and equals $S_{21}$, while G equals $S_{22}$ and H is zero.

The discrete set of F, G and H values can either be used as "table-based model", e.g. using local third order interpolation to obtain F, G and H values for values of $|a_1(f_0)|$ different than those used during model extraction. Another possibility is using a parametric model.

After extracting the model parameters, it makes sense to verify the validity of the linearity assumption with respect to the incident wave $a_2(f_0)$ at the output port 2 of the DUT 3. This validity depends both on the covered range of mismatches (inner portion of the circle of FIG. 2) and on the input power sweep ($|a_1(f_0)|$). For this purpose the "goodness of fit" can be calculated, being the squared cross-correlation of measured and predicted output $b_2(f_0)$. FIG. 7 shows this parameter as a function of the input power sweep.

It will be appreciated that the reduction of the absolute error of the predicted output $b_2(f_0)$ is strongly related to the validity of this linearization.

Another way to look for the presence of remaining model errors, is to plot the complex error (imaginary part versus real part) and use the fact that one has performed repeated measurements. In the ideal case (no model errors), the errors have a Gaussian distribution based on the measurement noise. Otherwise, one clearly notices that the complex errors are clustered, the number of points per cluster corresponding to the number of repeated measurements.

In order to get an idea of the performance of the model, extracted at the carrier frequency (5.25 GHz in the case of the IMEC LNA), when used to predict the output of the DUT 3 under modulated excitation around that carrier, the static behavior of the device under test has to be verified.

A band-limited modulation signal can be considered as a carrier which has a time-varying amplitude and phase. As such one can plot the time-varying amplitude at the output versus that at the input of the DUT, resulting in a "dynamic compression characteristic" as shown in FIG. 7. If this characteristic does not show any hysteresis, this is an indication that the device under test can be considered as being static around that carrier. Small hysteresis is not always clearly visible. At that moment it might help to plot the above information as function of time. In the case of a two-tone excitation, asymmetry in the output envelope indicates dynamic behavior.

Certain applications rely on constant gain curves in order to determine an optimal load as a function of the input power. Again, in practice, passive or active loadpull is used to obtain these curves. It will be shown that the linearized model (extracted using commonly available loads like attenuators, a 50 Ohm load, a short and delay lines) allows to create these constant gain curves too. This is done by solving next set of equations:

$$b_2(f_0)=F(|a_1(f_0)|)\cdot|a_1(f_0)|+G(|a_1(f_0)|)a_2(f_0)+H(|a_1(f_0)|)a_2^*(f_0) \quad (8)$$

$$a_2(f_0)=\Gamma_L(f_0)b_2(f_0) \quad (9)$$

For any given value of $|a_1(f_0)|$ and $\Gamma_L(f_0)$, one can easily find the solution for $a_2(f_0)$ $b_2(f_0)$, based on the known value of F, G and H for the specified $|a_1(f_0)|$. At that moment it is trivial to calculate the corresponding value of the gain:

$$G=(|b_2(f_0)|^2-a_2(f_0)|^2)/|a_1(f_0)|^2 \quad (10)$$

Doing so for any fixed value of $|a_1(f_0)|$ and for an equidistant grid of $\Gamma_L(f_0)$ values, one can use a mathematical modelling tool like Mathematica™ to generate contour plots to obtain the constant gain curves. Of course one must remain careful not to extrapolate the model with respect to $\Gamma_L(f_0)$ and especially $|a_1(f_0)|$.

For the purpose of the present invention, FIG. 8 shows a simplified embodiment of an arrangement 25 having an input terminal 10 and a plurality of loads 11, 12, 13, attenuators 14, 15, 16, 17 and delay lines 18, 19, 20. Load 11 is a matched load, e.g. a 50 ohm load. Reference numeral 12 denotes an open load, or simply an open, and reference numeral 13 represents a short load, or simply a short. The attenuators 14, 15, 16 and 17 may represents attenuations of 0 dB, 3 dB, 6 dB and 9 dB, for example. The delay lines 18, 19 and 20 represent small time delays of, for example, 40 ps or multiples thereof, such as provided by one or a plurality of connector savers. Note that the relative delay differences of the paths are important, not the absolute delay of each path.

Those skilled in the art will appreciate that the attenuators 14, 15, 16 and 17 can be replaced by a so-called step attenuator, without departing from the present invention.

For automated test measurement, the loads, attenuators and delays connect to each other by switches 21, 22, and 23. Although these switches, for simplicity sake, have been shown as mechanical switches, in practice it will be electronically (software) controllable semiconductor switches. Such switches are well-known to the skilled person and need no further explanation here.

Although the invention has been explained and illustrated with reference to a particular DUT and a particular arrangement of loads, attenuators and delays, as well as a particular model for characterizing the non-linear behavior of an RF and microwave device, those skilled in the art will be appreciated that the invention can be applied to measurements of other DUTs and other mathematical models and arrangements of loads, attenuators, delays and switches.

The method according to the invention can be readily implemented in a computer program product, comprising code means stored on a computer readable medium or data carrier, for use with a processing device for automated test measurement and extraction of model parameters, when the program is loaded into the processing device.

What is claimed is:

1. A method of characterizing non-linear behavior of a device under test, said device having input and output signal ports, wherein said method comprises the steps of:

exciting said device by an RF signal under different load conditions;

measuring signal data at said input and output ports of said device;

verifying whether said measurement data meet predetermined quality criteria;

calculating, from said measurement data, model parameters of a predetermined mathematical characterization model for characterizing said non-linear behavior of said device, wherein said calculating said model parameters comprises substituting said measurement data in said predetermined mathematical characterization model and solving an overdetermined set of equations; and verifying assumptions made in said predetermined mathematical characterization model by collecting additional measurement data and comparing same with data calculated from said predetermined mathematical characterization model using said model parameters, wherein said load conditions are obtained by connecting to said output port of said device:
(a) a matched load;
(b) an open;
(c) a short, and
(d) repeating steps (a) through (c) by connecting said loads using a plurality of attenuators and a plurality of delays.

2. A method according to claim 1, wherein said attenuators are selected for collecting measurement data for characterizing said non-linear behavior of said device in a desired region of load mismatches.

3. A method according to claim 1, wherein said delays are selected such that said load mismatches are distributed, substantially uniformly, along a circle in a Smith chart diagram.

4. A method according to claim 1, wherein said set of equations is solved in a least square sense using singular value decomposition.

5. A method according to claim 1, wherein said step of verifying whether said measurement data meet predetermined quality criteria comprises a verification whether said set of equations is well-conditioned.

6. A method according to claim 1, wherein said step of verifying whether said measurement data meet predetermined quality criteria comprises a verification whether said different load conditions are uniformly distributed along a circle in a Smith chart diagram.

7. A method according to claim 1, wherein said predetermined mathematical characterization model is developed based on a linearity assumption with respect to incident signals at said output port of said device, and wherein said step of verifying said assumptions made in said predetermined mathematical characterization model comprises a calculation of the "goodness of fit", being the squared cross-correlation of measured and predicted output signals of said device.

8. A method according to claim 1, wherein said predetermined mathematical characterization model is developed based on a static behavior assumption, and wherein said step of verifying said assumptions made in said predetermined mathematical characterization model comprises the provision of a dynamic compression characteristic which is a plot of an output time-varying signal amplitude at said output port versus an input time-varying signal amplitude at said input port of said device, and analyzing hysteresis of said dynamic compression characteristic.

9. A method according to claim 1, wherein said predetermined mathematical characterization model is developed based on an assumption of static behavior of said device, and wherein said step of verifying said assumptions made in said characterization model comprises a verification of dynamics of bias signals applied to said device.

10. A method according to claim 1, wherein said steps are performed under continuous wave excitation of said device.

11. A method according to claim 1, wherein said steps are performed under modulated excitation of said device.

12. A method according to claim 1, wherein said measurement data are collected using a Non-linear Network Measurement System.

13. A computer program product, comprising program code stored on a computer readable medium for performing a method according to claim 1 when said program product is run on a processing device.

14. A computer program product according to claim 13, wherein said program code automatically performs said method when said program product is running on said processing device.

15. A method according to claim 1, wherein said attenuators are selected for characterizing said non-linear behavior of said device under near matched load conditions.

16. A method according to claim 1, wherein said delays, attenuators and loads are designed for use in a near 50 ohm mismatch measurement environment.

17. An arrangement, comprising:
an input terminal for connecting to an RF or microwave device under test;
a source for exciting said device under test by an RF signal;
a plurality of delays;
a plurality of attenuators;
a matched load;
an open load;
a short;
a switching device that selectively combines any of said delays, attenuators and loads for providing a plurality of load conditions for said device under test;
a measuring module for measuring signal data at an input port and an output port of said device during said plurality of load conditions; and
a processor for:
(a) verifying whether said measured signal data meet predetermined quality criteria;
(b) calculating from said measured signal data, model parameters of a predetermined mathematical characterization model for characterizing said non-linear behavior of said device, wherein said calculating said model parameters comprises substituting said measurement data in said predetermined mathematical characterization model and solving an overdetermined set of equations; and
(c) verifying assumptions made in said predetermined mathematical characterization model by collecting additional measurement data and comparing same with data calculated from said predetermined mathematical characterization model using said model parameters.

18. An arrangement according to claim 17, wherein said switching device is electronically controllable.

19. An arrangement according to claim 17, wherein said delays, attenuators and loads are designed for use in a near 50 ohm mismatch measurement environment.

20. The arrangement of claim 17, wherein said plurality of load conditions include a plurality of load mismatches distributed, substantially uniformly, along a circle in a Smith chart diagram.

* * * * *